(12) United States Patent
Bernoudy et al.

(10) Patent No.: US 11,593,695 B2
(45) Date of Patent: Feb. 28, 2023

(54) SYSTEMS AND METHODS FOR HYBRID ANALOG AND DIGITAL PROCESSING OF A COMPUTATIONAL PROBLEM USING MEAN FIELDS

(71) Applicant: D-WAVE SYSTEMS INC., Burnaby (CA)

(72) Inventors: William W. Bernoudy, Vancouver (CA); Mohammad H. Amin, Coquitlam (CA); James A. King, Vancouver (CA); Jeremy P. Hilton, Vancouver (CA); Richard G. Harris, Vancouver (CA); Andrew J. Berkley, Vancouver (CA); Kelly T. R. Boothby, Vancouver (CA)

(73) Assignee: D-WAVE SYSTEMS INC., Burnaby (CA)

( * ) Notice: Subject to any disclaimer, the term of this patent is extended or adjusted under 35 U.S.C. 154(b) by 359 days.

(21) Appl. No.: 16/830,650

(22) Filed: Mar. 26, 2020

(65) Prior Publication Data
US 2020/0311591 A1    Oct. 1, 2020

Related U.S. Application Data

(60) Provisional application No. 62/824,124, filed on Mar. 26, 2019.

(51) Int. Cl.
*G06F 17/00* (2019.01)
*G06N 10/00* (2022.01)
(Continued)

(52) U.S. Cl.
CPC ............ *G06N 10/00* (2019.01); *G06N 10/60* (2022.01); *G06F 15/16* (2013.01); *G06F 17/00* (2013.01);
(Continued)

(58) Field of Classification Search
CPC .......... G06F 15/16; G06F 17/00; G06F 17/10; G06N 10/00; G06N 10/40; G06N 10/60; H03K 19/00
See application file for complete search history.

(56) References Cited

U.S. PATENT DOCUMENTS

| | | | |
|---|---|---|---|
| 7,135,701 | B2 | 11/2006 | Amin et al. |
| 7,369,035 | B2 | 5/2008 | Konno et al. |

(Continued)

FOREIGN PATENT DOCUMENTS

| | | |
|---|---|---|
| KR | 20160132943 A | 11/2016 |
| KR | 20180067006 A | 6/2018 |

(Continued)

OTHER PUBLICATIONS

Non-Final Office Action dated Jun. 3, 2022 in U.S. Appl. No. 16/741,208.

(Continued)

*Primary Examiner* — Kurtis R Bahr
(74) *Attorney, Agent, or Firm* — Cozen O'Connor (57) ABSTRACT

A hybrid computing system for solving a computational problem includes a digital processor, a quantum processor having qubits and coupling devices that together define a working graph of the quantum processor, and at least one nontransitory processor-readable medium communicatively coupleable to the digital processor which stores at least one of processor-executable instructions or data. The digital processor receives a computational problem, and programs the quantum processor with a first set of bias fields and a first set of coupling strengths. The quantum processor generates samples as potential solutions to an approximation of the problem. The digital processor updates the approximation by determining a second set of bias fields based at least in part on the first set of bias fields and a first set of mean fields (Continued)

that are based at least in part on the first set of samples and coupling strengths of one or more virtual coupling devices.

23 Claims, 4 Drawing Sheets

(51) Int. Cl.
    *G06N 10/60*           (2022.01)
    *G06F 15/16*           (2006.01)
    *G06F 17/10*           (2006.01)
    *G06N 10/40*           (2022.01)
    *H03K 19/00*          (2006.01)

(52) U.S. Cl.
    CPC .............. *G06F 17/10* (2013.01); *G06N 10/40* (2022.01); *H03K 19/00* (2013.01)

(56) References Cited

U.S. PATENT DOCUMENTS

| | | | |
|---|---|---|---|
| 7,398,163 | B2 | 7/2008 | Tsukamoto et al. |
| 7,418,283 | B2 | 8/2008 | Amin |
| 7,533,068 | B2 | 5/2009 | Maassen et al. |
| 7,619,437 | B2 | 11/2009 | Thom et al. |
| 7,639,035 | B2 | 12/2009 | Berkley |
| 7,870,087 | B2 | 1/2011 | Macready et al. |
| 7,870,523 | B1 | 1/2011 | Uziel et al. |
| 7,876,248 | B2 | 1/2011 | Berkley et al. |
| 7,898,282 | B2 | 3/2011 | Harris et al. |
| 7,984,012 | B2 | 7/2011 | Coury et al. |
| 8,008,942 | B2 | 8/2011 | Van et al. |
| 8,035,540 | B2 | 10/2011 | Berkley et al. |
| 8,063,657 | B2 | 11/2011 | Rose |
| 8,190,548 | B2 | 5/2012 | Choi |
| 8,195,596 | B2 | 6/2012 | Rose et al. |
| 8,195,726 | B2 | 6/2012 | Macready et al. |
| 8,283,943 | B2 | 10/2012 | Van Den Brink et al. |
| 8,421,053 | B2 | 4/2013 | Bunyk et al. |
| 8,437,818 | B1 | 5/2013 | Tolpygo et al. |
| 8,464,542 | B2 | 6/2013 | Hilton et al. |
| 8,494,993 | B2* | 7/2013 | Harris .................... G06N 10/00 706/45 |
| 8,772,759 | B2 | 7/2014 | Bunyk et al. |
| 9,170,278 | B2 | 10/2015 | Neufeld |
| 9,178,154 | B2 | 11/2015 | Bunyk |
| 9,183,508 | B2 | 11/2015 | King |
| 9,875,444 | B2 | 1/2018 | King |
| 9,898,689 | B2 | 2/2018 | Shamaie |
| 10,031,887 | B2 | 7/2018 | Raymond |
| 10,169,445 | B2 | 1/2019 | Weinstein et al. |
| 10,268,622 | B2 | 4/2019 | Hilton et al. |
| 10,552,755 | B2 | 2/2020 | Lanting et al. |
| 10,846,366 | B1* | 11/2020 | Otterbach ............... G06F 17/17 |
| 11,062,227 | B2* | 7/2021 | Amin ................... G06N 3/0445 |
| 11,194,573 | B1 | 12/2021 | Smith |
| 11,288,121 | B2 | 3/2022 | Katabarwa |
| 2002/0163518 | A1* | 11/2002 | Rising, III ......... H04N 21/2353 345/440 |
| 2005/0224784 | A1* | 10/2005 | Amin ..................... B82Y 10/00 257/14 |
| 2006/0225165 | A1 | 10/2006 | Maassen et al. |
| 2007/0239366 | A1 | 10/2007 | Hilton et al. |
| 2008/0065573 | A1 | 3/2008 | Macready |
| 2009/0070402 | A1 | 3/2009 | Rose et al. |
| 2009/0075825 | A1 | 3/2009 | Rose et al. |
| 2009/0232191 | A1 | 9/2009 | Gupta et al. |
| 2009/0299947 | A1 | 12/2009 | Amin et al. |
| 2010/0281885 | A1 | 11/2010 | Black et al. |
| 2011/0022820 | A1 | 1/2011 | Bunyk et al. |
| 2011/0060710 | A1 | 3/2011 | Amin |
| 2011/0065585 | A1 | 3/2011 | Lanting et al. |
| 2011/0231462 | A1 | 9/2011 | Macready et al. |
| 2011/0298489 | A1 | 12/2011 | Van et al. |
| 2013/0117200 | A1 | 5/2013 | Thom |
| 2013/0282636 | A1 | 10/2013 | Macready et al. |
| 2014/0025606 | A1 | 1/2014 | Macready |
| 2014/0187427 | A1 | 7/2014 | Macready et al. |
| 2014/0337612 | A1 | 11/2014 | Williams |
| 2015/0269124 | A1* | 9/2015 | Hamze ................... G06N 20/00 703/2 |
| 2015/0297949 | A1 | 10/2015 | Aman et al. |
| 2015/0310350 | A1 | 10/2015 | Niskanen et al. |
| 2015/0358022 | A1 | 12/2015 | McDermott et al. |
| 2015/0363708 | A1* | 12/2015 | Amin ..................... G06N 10/00 712/42 |
| 2016/0321559 | A1 | 11/2016 | Rose et al. |
| 2017/0177534 | A1 | 6/2017 | Mohseni et al. |
| 2017/0255629 | A1* | 9/2017 | Thom .................... G06N 10/00 |
| 2017/0255872 | A1 | 9/2017 | Hamze et al. |
| 2017/0300817 | A1 | 10/2017 | King et al. |
| 2017/0323195 | A1 | 11/2017 | Crawford et al. |
| 2018/0091440 | A1 | 3/2018 | Dadashikelayeh et al. |
| 2018/0096085 | A1* | 4/2018 | Rubin .................... G16C 10/00 |
| 2018/0218279 | A1 | 8/2018 | Lechner et al. |
| 2018/0246848 | A1* | 8/2018 | Douglass ............... G06N 10/00 |
| 2018/0246851 | A1* | 8/2018 | Zaribafiyan ............ G06F 17/18 |
| 2018/0260245 | A1 | 9/2018 | Smith |
| 2018/0336166 | A1 | 11/2018 | Forster |
| 2018/0365585 | A1 | 12/2018 | Smith et al. |
| 2019/0019101 | A1 | 1/2019 | Neven |
| 2020/0005186 | A1 | 1/2020 | Romero et al. |
| 2020/0026551 | A1 | 1/2020 | Ducore et al. |
| 2020/0027029 | A1 | 1/2020 | Linvill |
| 2020/0073739 | A1 | 3/2020 | Rungta et al. |
| 2020/0089832 | A1* | 3/2020 | Shao ....................... G06F 30/30 |
| 2020/0134502 | A1 | 4/2020 | Anschuetz et al. |
| 2020/0175413 | A1 | 6/2020 | Hsu et al. |
| 2020/0226197 | A1* | 7/2020 | Woerner ................ G06N 10/00 |
| 2020/0234172 | A1 | 7/2020 | King et al. |
| 2020/0302306 | A1 | 9/2020 | Matsuo et al. |
| 2021/0097776 | A1 | 4/2021 | Faulkner et al. |
| 2021/0334081 | A1 | 10/2021 | Chong et al. |
| 2021/0357797 | A1 | 11/2021 | Karalekas et al. |
| 2022/0019928 | A1* | 1/2022 | Jiang ...................... G06F 15/16 |

FOREIGN PATENT DOCUMENTS

| | | |
|---|---|---|
| WO | 2009152180 A2 | 12/2009 |
| WO | 2012064974 A2 | 5/2012 |
| WO | 2013006836 A1 | 1/2013 |
| WO | 2015143439 A1 | 9/2015 |
| WO | 2017214331 A1 | 12/2017 |
| WO | 2018119522 A1 | 7/2018 |

OTHER PUBLICATIONS

Non-Final Office Action Issued in U.S. Appl. No. 16/601,097 dated Apr. 8, 2022, 22 pages.
Non-Final Office Action Issued in U.S. Appl. No. 16/997,252 dated May 26, 2022, 13 pages.
Amin, "Effect of Local Minima on Adiabatic Quantum Optimization," Physical Review Letters 100(130503), 2008, 4 pages.
B. Bauer et al., "Hybrid Quantum Classical Approach to Correlated Materials", arXiv.1510.03859V2, Aug. 29, 2016.
Booth, M. et al., "Partitioning Optimization Problems for Hybrid Classical/Quantum Execution," D-Wave Technical Report, Jan. 9, 2017, 13 pages.
E. Blanzieri et al., "Quantum Annealing Tabu Search for QUBO Optimization", arXiv.1810.09342V1, Oct. 22, 2018.
Inoue et al. "Simulation and Experimental Demonstration of Logic Circuits Using an Ultra-Low-Power Adiabatic Quantum-Flux-Parametron," in IEEE Transactions on Applied Superconductivity, vol. 23, No. 3, pp. 1301105-1301105, Jun. 2013.
International Search Report and Written Opinion for PCT/US2020/013366, dated May 7, 2020, 9 pages.
Notice of Allowance dated Feb. 2, 2022, for Thom, "Systems and Methods for Analog Processing of Problem Graphs Having Arbitrary Size and/or Connectivity" U.S. Appl. No. 16/778,295; 29 pages.

(56) References Cited

OTHER PUBLICATIONS

O. A. Mukhanov, "Energy-Efficient Single Flux Quantum Technology," in IEEE Transactions on Applied Superconductivity, vol. 21, No. 3, pp. 760-769, Jun. 2011, doi: 10.1109/TASC.2010.2096792.
Pastorello, D. et al., "Quantum Annealing Learning Search for Solving QUBO Problems," arXiv:1810.09342v3 [quant-ph] Aug. 13, 2019, 17 pages.
S. R. Ekanayake, T. Lehmann, A. S. Dzurak and R. G. Clark, "Quantum bit controller and observer circuits in SOS-CMOS technology for gigahertz low-temperature operation," 2007 7th IEEE Conference on Nanotechnology (IEEE NANO), 2007, pp. 1283-1287.
Tran, T. et al., "A Hybrid Quantum-Classical Approach to Solving Scheduling Problems," Proceedings of the Ninth International Symposium on Combinational Search, 2016, 9 pages.
Williams, "Systems and Methods for Interacting With a Quantum Computing System," U.S. Appl. No. 61/811,457, filed Apr. 12, 2013, 55 pages.
Wocjan, Pawel, and Anura Abeyesinghe. "Speedup via quantum sampling." Physical Review A 78.4 (2008): 042336.
Ajagekar, et al., "Quantum computing for energy systems optimization: Challenges and opportunities" May 2, 2019, 34 pages.
Goldman, et al., "Parameter-less Population Population Pyramid", Beacon Center for the Study of evolution in Action, 2014, pp. 785-792.
Hamerly, et al., "Scaling advantages of all-to-all connectivity in physical annealers" the Coherent Ising Machine vs. D-Wave 2000Q, ArXiv:1805.052217v1 [quant-ph], May 14, 2018, 17 pages.
International Search Report and Written Opinion for PCT/IB2022/000201 dated Sep. 8, 2022, 15 pages.
Katzgraber et al., "A small -world search for quantum speedup: How small-world interactions can lead to improved quantum annealers designs", arXiv:1805.09510v1 [quant-ph], May 4, 2018, 11 pages.
Thierens, "The Linkage Tree Genetic Algorithm", R. Schaefer et al. (Eds.): PPSN XI, Part I, LNCS 6238, pp. 264-273, Springer-Verlag Berlin Heidelberg 2010.

\* cited by examiner

SYSTEMS AND METHODS FOR HYBRID ANALOG AND DIGITAL PROCESSING OF A COMPUTATIONAL PROBLEM USING MEAN FIELDS

TECHNICAL FIELD

This disclosure generally relates to solving problems represented in graph form via analog and digital processors, and may particularly be useful in quantum computing via quantum processors.

BACKGROUND

At least some analog processors (e.g., quantum processors) provide a plurality of analog computation devices (e.g., qubits) which are controllably coupled to each other by couplers (also referred to in the present application as coupling devices). Problems may be "embedded" on the processor for computation (e.g., by representing the problems as problem graphs where vertices and edges correspond to computation devices and couplers, respectively). The number of physical computation devices and couplers provided by the processor is often limited, which constrains the size (in terms of vertices) and connectivity (in terms of edges) of problem graphs which may be conveniently embedded on the analog processor.

This constraint is a significant driver in the ongoing effort to develop ever-larger (in terms of computing devices) and more connected (in terms of couplers) analog processors. Such analog processors are generally capable of having larger and/or more connected problem graphs embedded on them and thus may be capable of solving a greater scope of problems. However, obtaining larger and/or more connected analog processors may involve substantial costs and/or may not even be possible at a particular time (e.g., because such a processor has yet to be designed or manufactured).

Other approaches can involve finding embeddings which more efficiently represent problems on the analog processor. For many combinations of problems and not-fully-connected processors, the process of embedding the problems on the processor involves some overhead in the form of requiring the use of additional computation devices and/or couplers. Some embedding algorithms may require less overhead than other embedding algorithms for a given processor/problem pair, and so finding appropriate embedding algorithms may expand the scope of problems which are representable on a given processor. However, such techniques are still bounded by the size and/or connectivity of the processor.

There is thus a general desire for systems and methods for expanding the set of problems which may be solved by a particular analog processor.

Some approaches employ interactions between an analog processor and a digital computing system. These approaches are described herein as hybrid approaches. For example, in an iterative method, an analog processor, such as a quantum computing system, may be designed, operated, and/or adapted to provide a rate of convergence that is greater than the rate of convergence of a digital computing system.

The foregoing examples of the related art and limitations related thereto are intended to be illustrative and not exclusive. Other limitations of the related art will become apparent to those of skill in the art upon a reading of the specification and a study of the drawings.

Solvers

A solver is a mathematical-based set of instructions executed via hardware circuitry that is designed to solve mathematical problems.

There are numerous solvers available, most of which are designed to execute on classical computing hardware, that is computing hardware that employs digital processors and/or digital processor-readable nontransitory storage media (e.g., volatile memory, non-volatile memory, disk-based media). More recently, solvers designed to execute on non-classical computing hardware are becoming available, for example solvers designed to execute on analog computers, for instance an analog computer including a quantum processor.

Adiabatic Quantum Computation

Adiabatic quantum computation typically involves evolving a system from a known initial Hamiltonian (the Hamiltonian being an operator whose eigenvalues are the allowed energies of the system) to a final Hamiltonian by gradually changing the Hamiltonian. A simple example of an adiabatic evolution is given by:

$$H_e = (1-s)H_i + sH_f$$

where $H_i$ is the initial Hamiltonian, $H_f$ is the final Hamiltonian, $H_e$ is the evolution or instantaneous Hamiltonian, and s is an evolution coefficient which controls the rate of evolution. Before the evolution begins, the system is typically initialized in a ground state of the initial Hamiltonian $H_i$ and the goal is to evolve the system in such a way that the system ends up in a ground state of the final Hamiltonian $H_f$ at the end of the evolution. If the evolution is too fast, then the system can transition to a higher energy state, such as the first excited state. Generally, an "adiabatic" evolution is considered to be an evolution that satisfies the adiabatic condition:

$$\dot{s}\langle 1|(dH_e/ds|0)\rangle = \delta g^2(s)$$

where $\dot{s}$ is the time derivative of s, g(s) is the difference in energy between the ground state and first excited state of the system (also referred to herein as the "gap size") as a function of s, and δ is a coefficient much less than 1. Generally, the initial Hamiltonian $H_i$ and the final Hamiltonian $H_f$ do not commute. That is, $[H_i, H_f] \neq 0$.

The process of changing the Hamiltonian in adiabatic quantum computing may be referred to as evolution. The rate of change, for example, change of s, is slow enough that the system is always in the instantaneous ground state of the evolution Hamiltonian during the evolution, and transitions at anti-crossings (i.e., when the gap size is smallest) are avoided.

Quantum Annealing

Quantum annealing is a computation method that may be used to find a low-energy state, typically preferably the ground state, of a system. The method relies on the underlying principle that natural systems tend towards lower energy states because lower energy states are more stable. Quantum annealing may use quantum effects, such as quantum tunneling, to reach a low-energy state; however, the final low-energy state may not be the global energy minimum. Adiabatic quantum computation, therefore, may be considered a special case of quantum annealing for which the system, ideally, begins and remains in its ground state throughout an adiabatic evolution. Thus, those of skill in the art will appreciate that quantum annealing systems and methods may generally be implemented on an adiabatic quantum computer. Throughout this specification and the appended claims, any reference to quantum annealing is intended to encompass adiabatic quantum computation unless the context requires otherwise.

Quantum annealing uses quantum mechanics as a source of disorder during the annealing process. The optimization problem is encoded in a Hamiltonian $H_P$, and the algorithm introduces quantum effects by adding a disordering Hamiltonian $H_D$ that does not commute with $H_P$. An example case is:

$$H_E \propto A(t)H_D + B(t)H_P$$

where $A(t)$ and $B(t)$ are time dependent envelope functions. The Hamiltonian $H_E$ may be thought of as an evolution Hamiltonian similar to $H_e$ described in the context of adiabatic quantum computation above. The delocalization may be removed by removing $H_D$ (i.e., reducing $A(t)$). The delocalization may be added and then removed. Thus, quantum annealing is similar to adiabatic quantum computation in that the system starts with an initial Hamiltonian and evolves through an evolution Hamiltonian to a final "problem" Hamiltonian $H_P$ whose ground state encodes a solution to the problem. If the evolution is slow enough, the system will typically settle in the global minimum (i.e., the exact solution), or in a local minimum close in energy to the exact solution. In quantum annealing, $H_P$ may encode an optimization problem but the system does not necessarily stay in the ground state at all times. The energy landscape of $H_P$ may be crafted so that its global minimum is the answer to the problem to be solved, and low-lying local minima are good approximations.

Quantum Processor

A quantum processor may take the form of a superconducting quantum processor. A superconducting quantum processor may include a number of qubits and associated local bias devices. A superconducting quantum processor may also employ couplers to provide tunable communicative connections between qubits. A qubit often will have more devices associated with it. Further details and embodiments of exemplary quantum processors that may be used in conjunction with the present systems and devices are described in, for example, U.S. Pat. Nos. 7,533,068; 8,008,942; 8,195,596; 8,190,548; and 8,421,053.

Many techniques for using quantum annealing to solve computational problems involve finding ways to directly map/embed a representation of a problem to the quantum processor. Generally, a problem is solved by first casting the problem in a contrived formulation (e.g., Ising spin glass, QUBO, etc.) because that particular formulation maps directly to the particular embodiment of the quantum processor being employed. An Ising spin glass with N variables, or spins $s \in [-1, +1]$, may be written as a cost function of the form:

$$E(s) = \sum_i^N h_i s_i + \sum_{i<j} J_{ij} s_i s_j$$

where $h_i$ and $J_{ij}$ are dimensionless quantities that specify a desired Ising spin glass instance. Solving this problem involves finding the spin configuration $s_i$ that minimizes E for the particular set of $h_i$ and $J_{ij}$ provided.

Hybrid Computing System Comprising a Quantum Processor

A hybrid computing system can include a digital computer communicatively coupled to an analog computer. In some implementations, the analog computer is a quantum computer and the digital computer is a classical computer.

The digital computer can include a digital processor that can be used to perform classical digital processing tasks described in the present systems and methods. The digital computer can include at least one system memory which can be used to store various sets of computer- or processor-readable instructions, application programs and/or data.

The quantum computer can include a quantum processor that includes programmable elements such as qubits, couplers, and other devices. The qubits can be read out via a readout system, and the results communicated to the digital computer. The qubits and the couplers can be controlled by a qubit control system and a coupler control system, respectively. In some implementations, the qubit and the coupler control systems can be used to implement quantum annealing on the analog computer.

Sampling

Throughout this specification and the appended claims, the terms "sample", "sampling", "sampling device", and "sample generator" are used. These terms are used herein in like manner to their corresponding uses in the arts of statistics and statistical analysis, and electrical engineering.

In statistics, a sample is a subset of a population, i.e., a selection of data taken from a statistical population. Sampling is the process of taking the sample, and typically follows a defined procedure. For example, in a population, database, or collection of objects, a sample may refer to an individual datum, data point, object, or subset of data, data points, and/or objects.

In electrical engineering and related disciplines, sampling relates to taking a set of measurements of an analog signal or some other physical system. Sampling may include conversion of a continuous signal to a discrete signal.

In many fields, including simulations of physical systems, and computing, especially analog computing, the foregoing meanings may merge. For example, a hybrid computer can draw samples from an analog computer. The analog computer, as a provider of samples, is an example of a sample generator. The analog computer can be operated to provide samples from a selected probability distribution, the probability distribution assigning a respective probability of being sampled to each data point in the population.

BRIEF SUMMARY

There exists a need to be able to process at least some problems having size and/or connectivity greater than (and/or at least not fully provided by) a working graph of an analog processor. Computational systems and methods are described which, at least in some implementations, allow for the computation of at least some problem graphs which have representations which do not fit within the working graph of an analog processor (e.g., because they require more computation devices and/or more/other couplers than the processor provides).

A method of operation of a hybrid computing system, the hybrid computing system comprising a digital processor and a quantum processor, the quantum processor comprising a plurality of qubits and one or more coupling devices, the qubits and the coupling devices defining a working graph of the quantum processor, may be summarized as comprising receiving a computational problem by the digital processor, the computational problem having a problem graph comprising a plurality of nodes and a first and a second set of edges, each set of edges comprising one or more edges, a first portion of the problem graph comprising the set of nodes and the first set of edges, the first portion which fits the working graph of the quantum processor; programming the quantum processor by the digital processor with a first set of bias fields and a first set of coupling strengths;

generating a first set of samples by the quantum processor, the first set of samples comprising one or more samples, the first set of samples comprising potential solutions to an approximation of the computational problem; determining a first set of mean fields by the digital processor, the first set of mean fields comprising one or more mean fields, the first set of mean fields based at least in part on the first set of samples and coupling strengths of one or more virtual coupling devices, each virtual coupling device corresponding to a respective edge in the second set of edges; and updating the approximation of the computational problem by determining a second set of bias fields based at least in part on the first set of bias fields and the first set of mean fields by the digital processor.

The method may further comprise programming the quantum processor by the digital processor with the second set of bias fields and a second set of coupling strengths; and generating a second set of samples by the quantum processor, the second set of samples comprising one or more samples, the second set of samples comprising potential solutions to the updated approximation of the computational problem. In some implementations, programming the quantum processor by the digital processor with a second set of coupling strengths includes programming the quantum processor by the digital processor with a second set of coupling strengths wherein the second set of coupling strengths is the same as the first set of coupling strengths.

In some implementations, determining a first set of mean fields by the digital processor includes determining a first set of mean fields by a specialized classical co-processor. In some implementations, determining a first set of mean fields by a specialized classical co-processor includes determining a first set of mean fields by one or more field programmable gate arrays (FPGAs).

In some implementations, determining a first set of mean fields by the digital processor includes determining magnetizations of the first set of samples. In some implementations, updating the approximation of the computational problem by determining a second set of bias fields $h_i'$ includes updating the first set of bias fields $h_i$ using the following equation:

$$h_i' \leftarrow h_i + \sum_j J_{i,j}^A M_j$$

wherein $M_i$ and $M_j$ are magnetizations of an $i^{th}$ and a $j^{th}$ qubit, respectively, and $J^A_{i,j}$ is a coupling strength of a virtual communicative coupling between an $i^{th}$ and a $j^{th}$ problem variable.

In some implementations, determining a first set of mean fields by the digital processor, each virtual coupling device corresponding to a respective edge in the second set of edges includes determining a first set of mean fields by the digital processor, each virtual coupling device corresponding to a respective edge in the second set of edges, the second set of edges absent from the working graph of the quantum processor.

The method may further comprise evaluating by the digital processor if an exit condition is met; until the exit condition is met, iteratively, where i≥2: programming the quantum processor by the digital processor with the $i^{th}$ set of bias fields and an $i^{th}$ set of coupling strengths; and generating an $i^{th}$ set of samples by the quantum processor, the $i^{th}$ set of samples comprising one or more samples, the $i^{th}$ set of samples comprising potential solutions to the updated approximation of the computational problem; determining an $i^{th}$ set of mean fields by the digital processor, the $i^{th}$ set of mean fields comprising one or more mean fields, the $i^{th}$ set of mean fields based at least in part on the $i^{th}$ set of samples and coupling strengths of one or more virtual coupling devices, each virtual coupling device corresponding to a respective edge in the second set of edges; and updating the approximation of the computational problem by determining an $(i+1)^{th}$ set of bias fields based at least in part on the $i^{th}$ set of bias fields and the $i^{th}$ set of mean fields by the digital processor.

In some implementations, programming the quantum processor by the digital processor with an $i^{th}$ set of coupling strengths includes programming the quantum processor by the digital processor with an $i^{th}$ set of coupling strengths wherein the $i^{th}$ set of coupling strengths is the same as the first set of coupling strengths. In some implementations, evaluating by the digital processor if an exit condition is met includes evaluating whether the $(i+1)^{th}$ set of samples is converging. In some implementations, evaluating whether the $(i+1)^{th}$ set of samples is converging includes evaluating whether a change between the $i^{th}$ set of bias fields and the $(i+1)^{th}$ set of bias fields exceeds a defined threshold. In some implementations, evaluating by the digital processor if an exit condition is met includes evaluating whether a count of iterations exceeds a defined limit. In some implementations, evaluating by the digital processor if an exit condition is met includes evaluating whether a change between the $i^{th}$ set of bias fields and the $(i+1)^{th}$ set of bias fields exceeds a defined threshold.

A hybrid computing system for solving a computational problem may be summarized as comprising a digital processor; a quantum processor, comprising a plurality of qubits and one or more coupling devices, the qubits and the coupling devices defining a working graph of the quantum processor; and at least one nontransitory processor-readable medium communicatively coupleable to the digital processor, the nontransitory processor-readable medium which stores at least one of processor-executable instructions or data which, when executed by the digital processor, cause the digital processor to receive a computational problem, the computational problem having a problem graph comprising a plurality of nodes and a first and a second set of edges, each set of edges comprising one or more edges, a first portion of the problem graph comprising the set of nodes and the first set of edges, the first portion which fits the working graph of the quantum processor; program the quantum processor with a first set of bias fields and a first set of coupling strengths; generate a first set of samples by the quantum processor, the first set of samples comprising one or more samples, the first set of samples comprising potential solutions to an approximation of the computational problem; determine a first set of mean fields, the first set of mean fields comprising one or more mean fields, the first set of mean fields based at least in part on the first set of samples and coupling strengths of one or more virtual coupling devices, each virtual coupling device corresponding to a respective edge in the second set of edges; and update the approximation of the computational problem by determining a second set of bias fields based at least in part on the first set of bias fields and the first set of mean fields.

The processor-executable instructions or data which, when executed by the digital processor, may further cause the digital processor to program the quantum processor with the second set of bias fields and a second set of coupling strengths; and generate a second set of samples by the quantum processor, the second set of samples comprising one or more samples, the second set of samples comprising potential solutions to the updated approximation of the computational problem.

In some implementations, the second set of coupling strengths is the same as the first set of coupling strengths.

In some implementations, the digital processor includes a specialized classical co-processor.

In some implementations, the first set of mean fields includes magnetizations of the first set of samples. In some implementations, the second set of bias fields $h_i'$ is given by the following equation:

$$h_i' \leftarrow h_i + \sum_j J_{i,j}^A M_j$$

wherein $h_i$ is the first set of bias fields, $M_i$ and $M_j$ are magnetizations of an $i^{th}$ and a $j^{th}$ qubit, respectively, and $J^A_{i,j}$ is a coupling strength of a virtual communicative coupling between an $i^{th}$ and a $j^{th}$ problem variable.

In some implementations, the second set of edges are absent from the working graph of the quantum processor.

The processor-executable instructions or data which, when executed by the digital processor, may further cause the digital processor to evaluate if an exit condition is met; until the exit condition is met, iteratively, where i≥2: program the quantum processor with the $i^{th}$ set of bias fields and an $i^{th}$ set of coupling strengths; and generate an $i^{th}$ set of samples by the quantum processor, the $i^{th}$ set of samples comprising one or more samples, the $i^{th}$ set of samples comprising potential solutions to the updated approximation of the computational problem; determine an $i^{th}$ set of mean fields by the digital processor, the $i^{th}$ set of mean fields comprising one or more mean fields, the $i^{th}$ set of mean fields based at least in part on the $i^{th}$ set of samples and coupling strengths of one or more virtual coupling devices, each virtual coupling device corresponding to a respective edge in the second set of edges; and update the approximation of the computational problem by determining an $(i+1)^{th}$ set of bias fields based at least in part on the $i^{th}$ set of bias fields and the $i^{th}$ set of mean fields.

In some implementations, the $i^{th}$ set of coupling strengths is the same as the first set of coupling strengths.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn, are not necessarily intended to convey any information regarding the actual shape of the particular elements and may have been solely selected for ease of recognition in the drawings.

DETAILED DESCRIPTION

In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with computer systems, server computers, and/or communications networks have not been shown or described in detail to avoid unnecessarily obscuring descriptions of the implementations.

Unless the context requires otherwise, throughout the specification and claims that follow, the word "comprising" is synonymous with "including," and is inclusive or open-ended (i.e., does not exclude additional, unrecited elements or method acts).

Reference throughout this specification to "one implementation" or "an implementation" means that a particular feature, structure or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

The headings and Abstract of the Disclosure provided herein are for convenience only and do not interpret the scope or meaning of the implementations.

Hybrid Computing Systems

Figure 1:
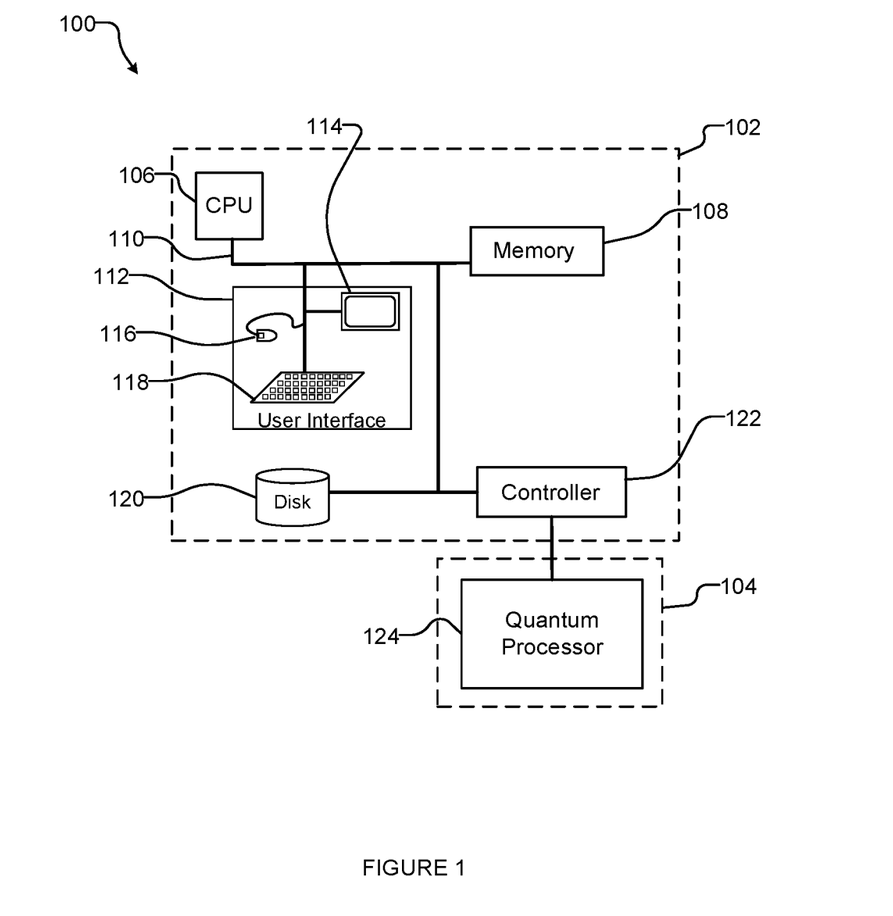
FIG. 1 is a schematic diagram of an example hybrid computing system comprising a quantum processor and a classical processor.

FIG. 1 illustrates a hybrid computing system 100 including a classical computer 102 coupled to a quantum computer 104. The example classical computer 102 includes a digital processor (CPU) 106 that may be used to perform classical digital processing tasks.

Classical computer 102 may include at least one digital processor (such as central processor unit 106 with one or more cores), at least one system memory 108, and at least one system bus 110 that couples various system components, including system memory 108 to central processor unit 106. The digital processor may be any logic processing unit, such as one or more central processing units ("CPUs"), graphics processing units ("GPUs"), digital signal processors ("DSPs"), application-specific integrated circuits ("ASICs"), programmable gate arrays ("FPGAs"), programmable logic controllers (PLCs), etc.

Classical computer 102 may include a user input/output subsystem 112. In some implementations, the user input/output subsystem includes one or more user input/output components such as a display 114, mouse 116, and/or keyboard 118.

System bus 110 can employ any known bus structures or architectures, including a memory bus with a memory controller, a peripheral bus, and a local bus. System memory

108 may include non-volatile memory, such as read-only memory ("ROM"), static random-access memory ("SRAM"), Flash NANO; and volatile memory such as random-access memory ("RAM") (not shown).

Classical computer 102 may also include other non-transitory computer- or processor-readable storage media or non-volatile memory 120. Non-volatile memory 120 may take a variety of forms, including: a hard disk drive for reading from and writing to a hard disk, an optical disk drive for reading from and writing to removable optical disks, and/or a magnetic disk drive for reading from and writing to magnetic disks. The optical disk can be a CD-ROM or DVD, while the magnetic disk can be a magnetic floppy disk or diskette. Non-volatile memory 120 may communicate with the digital processor via system bus 110 and may include appropriate interfaces or controllers 122 coupled to system bus 110. Non-volatile memory 120 may serve as long-term storage for processor- or computer-readable instructions, data structures, or other data (sometimes called program modules) for classical computer 102.

Although classical computer 102 has been described as employing hard disks, optical disks and/or magnetic disks, those skilled in the relevant art will appreciate that other types of non-volatile computer-readable media may be employed, such magnetic cassettes, flash memory cards, Flash, ROMs, smart cards, etc. Those skilled in the relevant art will appreciate that some computer architectures employ volatile memory and non-volatile memory. For example, data in volatile memory can be cached to non-volatile memory, or a solid-state disk that employs integrated circuits to provide non-volatile memory.

Various processor- or computer-readable instructions, data structures, or other data can be stored in system memory 108. For example, system memory 108 may store instruction for communicating with remote clients and scheduling use of resources including resources on classical computer 102 and quantum computer 104. For example, system memory 108 may store processor- or computer-readable instructions, data structures, or other data which, when executed by a processor or computer causes the processor(s) or computer(s) to execute one, more or all of the acts of method 400 of FIG. 4.

In some implementations, system memory 108 may store processor- or computer-readable calculation instructions to perform pre-processing, co-processing, and post-processing to quantum computer 104. System memory 108 may store at set of quantum computer interface instructions to interact with quantum computer 104.

Quantum computer 104 may include one or more quantum processors such as quantum processor 124. Quantum computer 104 can be provided in an isolated environment, for example, in an isolated environment that shields the internal elements of the quantum computer from heat, magnetic field, and other external noise (not shown). Quantum processor 124 includes programmable elements such as qubits, couplers and other devices. In accordance with the present disclosure, a quantum processor, such as quantum processor 124, may be designed to perform quantum annealing and/or adiabatic quantum computation. Examples of quantum processors are described in U.S. Pat. No. 7,533,068.

Quantum Processor Topology

In some implementations, the qubits and couplers in a quantum processor are arranged in an architecture (or topology) such that a certain number of qubits are laid out into a number of sub-topologies, each sub-topology also referred to herein as a cell of qubits (hereinafter "cell"). A cell is a repeated sub-topology of a quantum processor topology comprising qubits and couplers. A plurality of cells tiled over an area produces a certain quantum processor architecture or topology. Each qubit in a cell may be included in only one cell such that no qubit may be included in multiple cells and no qubit may be shared among multiple cells.

A qubit within a cell can be communicatively coupled to another qubit within the same cell by a coupler referred to herein as an intra-cell coupler. A qubit in one cell can be communicatively coupled to another qubit in a different cell by a coupler referred to herein as an inter-cell coupler.

Figure 2:
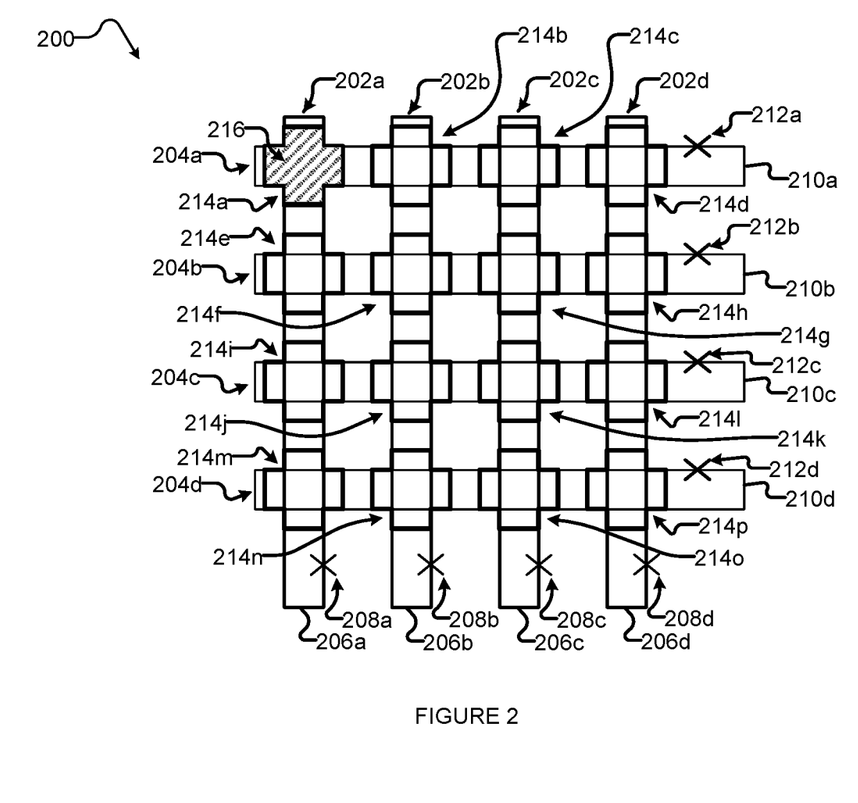
FIG. 2 is a schematic diagram of an example topology of a quantum processor.

FIG. 2 shows an example cell 200 of a quantum processor which includes qubits 202a-202d (collectively, 202) and qubits 204a-204d (collectively, 204). A plurality of cells, or sub-topologies, may form a topology of a quantum processor. Cell 200 may be a portion of a quantum processor's topology.

In FIG. 2, qubits 202 are laid out vertically (up and down the page), and qubits 220 are laid out horizontally (across the page). A person of skill in the art will appreciate that while cell 200 includes eight qubits—qubits 202 laid out horizontally and qubits 204 laid out vertically—the number of qubits per cell can vary, and embodiments may comprise more or less than eight qubits per cell.

Qubits 202 and 204 may be superconducting qubits. Qubits 202 and 204 may be superconducting flux qubits. Each qubit of qubits 202 may include a respective loop of superconducting material 206a-206d (collectively, 206) interrupted by at least one respective Josephson junction 208a-208d (collectively, 208). Each qubit of qubits 204 may include a respective loop of superconducting material 210a-210d (collectively, 210) interrupted by at least one respective Josephson junction 212a-212d (collectively, 212).

Intra-cell couplers 214a-214p (collectively, 214) communicatively couple qubits 202 and 204. Each intra-cell coupler of intra-cell couplers 214 may include a respective loop of superconducting material wherein the loop of superconducting material may define a perimeter to a coupling region 216 (illustrated in FIG. 2 by a patterned fill and referring to coupler 204a, only one coupling region called out in FIG. 2). Intra-cell couplers 214 may be tunable. A strength of a coupling of an intra-cell coupler of intra-cell couplers 214 between a qubit of qubits 202 and a qubit of qubits 204 can be adjusted during operation of the quantum processor. The coupling may be adjusted between computations, for example to embed a problem into the quantum processor.

The systems and methods described herein for analog processing of problem graphs are applicable to an analog processor (e.g., a quantum processor) that includes the sub-topology illustrated by cell 200 of FIG. 2. The systems and methods described herein are also applicable to an analog processor (e.g., a quantum processor) that includes a different sub-topology from the one illustrated by cell 200 of FIG. 2. The systems and methods described herein may be implemented by analog processors that include suitable hardware graphs. A hardware graph is a graph that represents the topology of the analog processor. For example, for a quantum processor that includes qubits and coupling devices, the hardware graph is a graph that includes nodes for the qubits and edges for the coupling devices. Example hardware sub-topologies and topologies are discussed in greater detail in, for example, U.S. Pat. Nos. 8,195,596, 8,063,657, 8,421,053, 8,772,759, 9,170,278, 9,178,154, 9,183,508, and International Patent Publication No. WO2017214331A1.

A problem graph is a graph representing a problem such as a computational problem. Some real-world problems may not be represented by a problem graph in the shape of cell 200 or by a similar topology or sub-topology structure. These problems can programmed on a quantum processor by means of a suitable embedding. Finding a suitable embedding can itself be a computationally hard problem. Furthermore, in finding a suitable embedding and solving an embedded problem on a quantum processor, increased coupling precision can be beneficial in ensuring or at least improving fidelity to the problem. In some implementations, the problem is an Ising problem.

A problem graph can include a plurality of nodes and one or more edges. A node of a graph (e.g., a problem graph) is said to be adjacent to another node in the graph if, and only if, there exists an edge between the two nodes in the graph.

The topology of a quantum processor can be thought of as an arrangement of: a) qubits at the nodes of a graph, and b) coupling devices forming the edges of the graph and providing communicative coupling between the qubits.

In the present specification, a qubit is said to be adjacent to another qubit if, and only if, there is a direct communicative coupling between the two qubits in the layout of the quantum processor. A pair of adjacent qubits may or may not be physically adjacent to each other. A pair of adjacent qubits may be in the same cell or in different cells to each other. If the pair of adjacent qubits are in the same cell, the coupler that is operable to provide a direct communicative coupling between those two qubits is denominated as an intra-cell coupler. If the pair of adjacent qubits are in different cells, the coupler that is operable to provide a direct communicative coupling between those two qubits is denominated as an inter-cell coupler.

A pair of non-adjacent qubits may be in the same cell or in different cells to each other. Whether the non-adjacent qubits are in the same cell or in different cells, there is by definition no coupler (intra-cell or inter-cell) operable to provide a direct communicative coupling between the qubits.

Programming a quantum processor can include supplying a bias field $h_i$ for each qubit i, and a sign and magnitude of a coupling strength $J_{ij}$ of the communicative coupling between pairs of qubits i and j. Solving a computational problem can include embedding a problem onto a working graph of the quantum processor. A working graph of a quantum processor is a portion of the hardware graph of the quantum processor used in the embedding of a problem. A native graph is a working graph that corresponds directly to the hardware graph of the quantum processor, or portion thereof. A native problem can be solved without embedding.

Work by Katzgraber et al. (Katzgraber H. G., and Novotny M. A., "A small-world search for quantum speedup: How small-world interactions can lead to improved quantum annealer designs", arXiv:1805.09510v2) has shown that while a topology comprising a plurality of cells 200 generally does not exhibit a finite-temperature spin-glass transition, "augmented" graphs obtained by adding one or more additional edges to a working graph of the topology can advantageously exhibit a transition to a glassy phase. An augmented graph is defined in this specification and appended claims as a graph that includes a hardware graph of a quantum processor and one or more additional edges (i.e., communicative couplings) between non-adjacent nodes (i.e., qubits) of the hardware graph. The one or more additional edges of the augmented graph do not exist as communicative couplings between qubits in the quantum processor. In the present specification and the appended claims, the additional communicative couplings of the augmented graph can provide tunable communicative coupling between non-adjacent qubits in the same cell and/or between non-adjacent qubits in different cells. Computational problems that can be represented by augmented graphs are of interest because they are typically among the more difficult problems to solve.

The one or more additional communicative couplings of the augmented graph are also referred to in the present application as augmented couplings. In some implementations, the one or more additional augmented couplers are long-range communicative couplings between non-adjacent qubits in the quantum processor. Long-range communicative couplings may provide a direct communicative coupling between nodes in the augmented problem graph that have been mapped to non-adjacent qubits in the quantum processor (i.e., qubits having no direct communicative coupling between them in the hardware graph). The term "long-range" indicates that the qubits in the hardware graph may be further spaced apart than other qubits. In some implementations, long-range communicative couplings between non-adjacent qubits may be operated with higher values of coupling strength than intra-cell or inter-cell couplers.

In the present application, the one or more additional augmented couplers are not a physical implementation of a coupling device. They are a computational tool for solving problems having augmented graphs by a hybrid computing system comprising a digital processor and a quantum processor where the quantum processor has a hardware graph that does not include the one or more additional augmented couplers.

Figure 3:
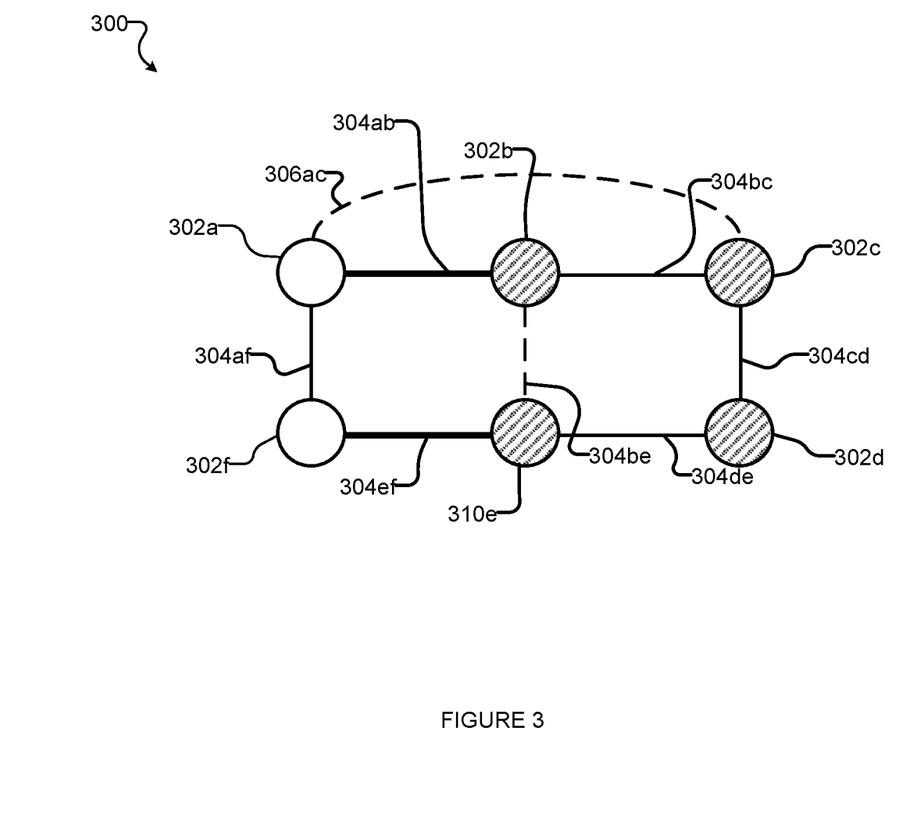
FIG. 3 is a schematic diagram of an example augmented topology.

FIG. 3 shows a schematic view of an example augmented topology 300. Augmented topology 300 comprises qubits 302a through 302f (collectively, 302). Qubits 302a and 302f belong to one cell (e.g., cell 200 of FIG. 2), and qubits 302b, 302c, 302d, and 302e belong to another cell (as indicated by the patterned fill).

Qubit 302a is adjacent to qubits 302b and 302f. Qubit 302a is communicatively coupled to adjacent qubits 302b and 302f by inter-cell coupler 304ab and intra-cell coupler 304af, respectively. An augmented coupling 304ac between non-adjacent qubits 302a and 302c is illustrated by means of a dashed line. Augmented coupling 302ac is an example of an inter-cell augmented coupling.

Qubit 302b is adjacent to qubits 302a, 302c, and 302e. Qubit 302b is communicatively coupled to adjacent qubits 302a and 302c by inter-cell coupler 304ab and intra-cell coupler 304bc, respectively. Qubit 302c is adjacent to qubits 302b and 302d. Qubit 302c is communicatively coupled to adjacent qubits 302b and 302d by intra-cell couplers 304bc, and 304cd, respectively. Qubit 302d is adjacent to qubits 302c and 302e. Qubit 302d is communicatively coupled to adjacent qubits 302c and 302e by intra-cell couplers 304cd, and 304de, respectively.

Qubit 302e is adjacent to qubits 302d and 302f. Qubit 302e is communicatively coupled to adjacent qubits 302d and 302f by intra-cell couplers 304de and 304ef, respectively. An augmented coupling 304be between non-adjacent qubits 302e and 302b is illustrated by means of a dashed line. Augmented coupling 302be is an example of an intra-cell augmented coupling.

Qubit 302f is adjacent to qubits 302a and 302e. Qubit 302f is communicatively coupled to adjacent qubits 302a and 302e by intra-cell coupler 304af and inter-cell coupler 304ef, respectively.

An augmented coupling may be provided between a pair of qubits not otherwise coupled by an intra-cell or inter-cell coupling. Augmented couplers are not physical couplers in a quantum processor. Rather, augmented couplers are computational tools used to solve problems having an augmented graph on a hybrid computing system as described in detail below with reference to FIG. 4.

Nodes in the augmented problem graph mapped to non-adjacent nodes in the hardware graph of the quantum processor have, by definition, no direct communicative couplings between them. Some approaches to embedding augmented problems on a quantum processor include forming indirect communicative couplings between non-adjacent qubits via other qubits and intra-cell and inter-cell couplers of the quantum processor. Indirect coupling of this kind can incur an overhead cost. The present systems and methods include approaches to solve, or at least approximately solve, augmented problems using a hybrid mean field solver, in which direct communicative coupling between nodes of the augmented graph are provided by augmented communicative couplings modeled by the hybrid solver. Augmented communicative couplings are also referred to as virtual communicative couplings in the present application.

Examples of augmented topologies are described, for example, in U.S. Pat. No. 10,268,622.

Hybrid Mean Field Solver

There may be some problems that do not fit directly on a topology without augmented couplings, for example a topology formed by a plurality of cells 200 (see description above in FIG. 2). These problems cannot generally be natively represented and solved by a quantum processor with such a topology. Some problem graphs can fit on an augmented graph (or be efficiently embedded in an augmented graph), and can be solved by a quantum processor operated in conjunction with a digital processor, and, which together, are able to effectively simulate an augmented topology (e.g., the augmented topology 300 of FIG. 3). This approach can be beneficial when there are "missing" couplings between qubits, i.e., edges in the problem graph that are missing from the working graph of the quantum processor. The augmented topology is a topology that includes the missing edges.

One approach to solving augmented problems (i.e., problems that fit an augmented topology) is to use classical solvers. Augmented problems may not fit directly on a native hardware graph of a quantum processor (e.g., a quantum processor with a topology formed by a plurality of cells 200 of FIG. 2), and thus may not be efficiently solvable by a quantum processor. Moreover, augmented problems may also be difficult to embed in such a quantum processor in an efficient way, unless, for example, the native hardware graph of the quantum processor is many times larger than the augmented graph of the problem.

An alternative approach to solve an augmented problem is to fit an approximation to the problem to the working graph of the quantum processor and to use a hybrid mean field solver on a quantum processor and a digital processor (e.g., specialized classical co-processor such as an FPGA) to include the effect of one or more virtual communicative couplings between nodes of the problem graph that are missing from the working graph of the quantum processor.

In the present specification and the appended claims, a virtual communicative coupling is defined as a mathematical abstraction of a coupler in a quantum processor topology. Virtual communicative couplings may also be referred to in the present application as virtual coupling devices, virtual couplers, artificial couplers, or simulated couplers.

The quantum processor may have a topology with "missing" couplings between qubits as described above. A hybrid mean field solver can take one or more samples from the quantum processor, determine the mean field due to the virtual communicative couplings between qubits, adjust the actual fields accordingly using the digital processor (e.g., the classical co-processor), resubmit the problem to the quantum processor with the adjusted fields, and repeat until convergence of the samples. In some implementations, the mean field is determined from a product of mean values of the one or more samples from the quantum processor and the coupling strength.

The classical co-processor advantageously acts in concert with the quantum processor to find good, or at least improved, solutions to an augmented problem by adjusting the actual fields to account for the virtual communicative couplings.

A hybrid mean field solver calculates effective mean fields due to the missing couplings on one or more samples generated by a quantum processor without an augmented topology, eliminating, or at least reducing, the need to build a quantum processor with a specific augmented topology. The hybrid mean field solver can be executed by a hybrid computing system (for example hybrid computing system 100 of FIG. 1) comprising a quantum processor and a digital processor (e.g., a classical co-processor).

A notable aspect of the systems and methods described in the present application is the use of a hybrid quantum-classical solver to solve computational problems where the solver includes a mean field component.

Figure 4:
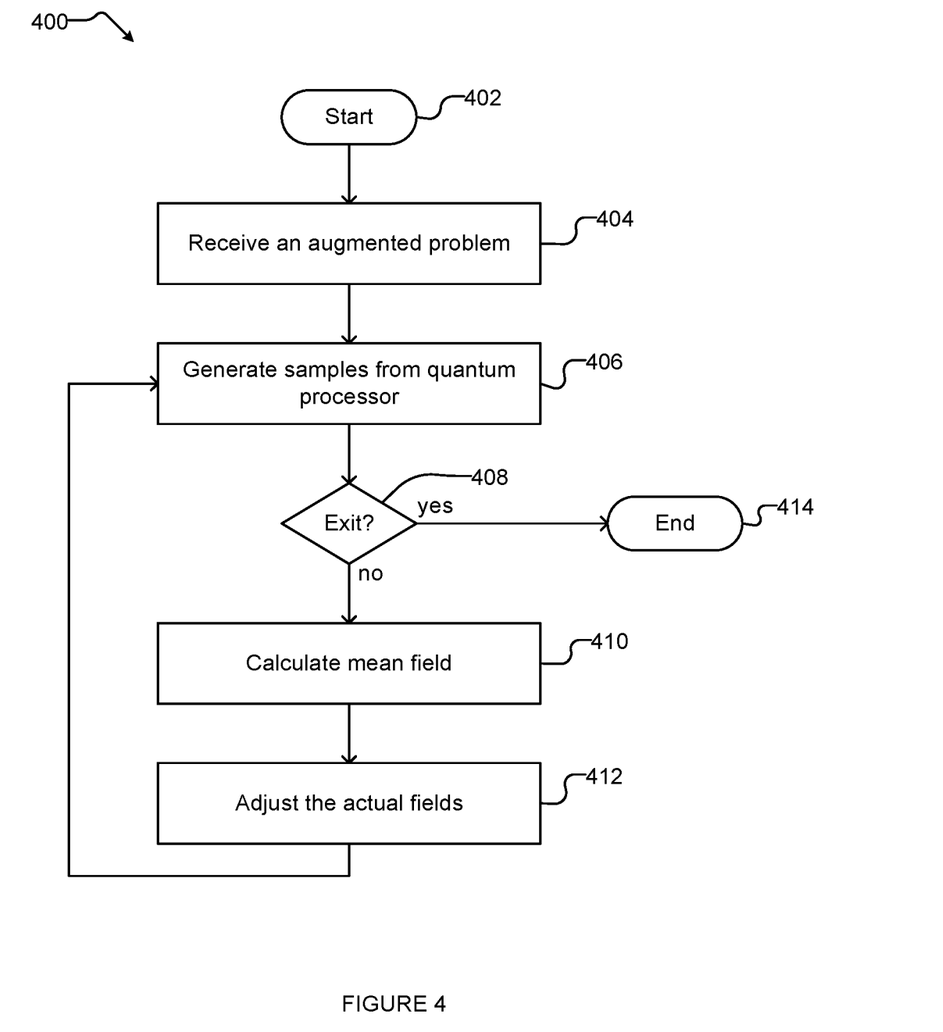
FIG. 4 is a schematic diagram of an example iterative method of operation of a hybrid computing system using mean fields.

FIG. 4 is a schematic diagram of an example iterative method 400 of operation of a hybrid computing system using mean fields. Method 400 comprises acts 401 to 414. A person skilled in the art will understand that the number of acts is an example, and, in some implementations, certain acts may be omitted, further acts may be added, and/or the order of the acts may be changed.

Method 400 may be executed on a hybrid computing system, for example hybrid computing system 100. Method 400 may be executed on a hybrid computing system comprising a quantum processor without an augmented topology. Method 400 is described with reference to a hybrid computing system (for example, hybrid computing system 100 of FIG. 1).

Method 400 starts at 402, for example in response to an invocation from another method.

At 404, a hybrid computing system receives a computational problem. The computational problem may be an augmented problem, which may not be amenable to efficient solution by the quantum processor in the absence of a hybrid mean field solver. The term "augmented problem" refers in the present application to a problem with an augmented problem graph. The systems and methods of the present application can be particularly beneficial if the augmented problem graph does not fit directly into a topology of the quantum processor (for example, quantum processor 124 of FIG. 1).

At 406, the quantum processor generates one or more samples. The hybrid computing system causes a hybrid mean field solver in a digital processor of the hybrid computing system (for example, digital processor 106 of FIG. 1) to program the quantum processor with a portion of the augmented problem, or an approximation of the problem, that can be defined on a native graph of the quantum processor.

For example, where h and J are the bias fields and the coupler strengths of the augmented problem received at 404, the hybrid mean field solver can program the quantum processor to generate samples $S_Q$ from a problem defined over $h^{mf}$ and $J^N$, where $h^{mf} \leftarrow h$ in a first execution of iterative method 400 and $J^N$ is the native portion of J, the samples expressed as follows:

$$S_Q \leftarrow QPU(h^{mf}, J^N)$$

At 408, the hybrid computing system checks whether an exit condition has been met. An exit condition can include execution of a predetermined number of iterations and/or the convergence of samples generated at 406, or whichever occurs first. Convergence may not be guaranteed for a particular computational problem. Convergence can be assessed, for example, by determining whether samples generated in an iteration differ by more than a predetermined threshold from samples generated in the previous iteration. If an exit condition has been met, control passes to 414, otherwise control passes to 410.

At 410, the hybrid mean field solver determines the mean fields and adjusts the bias fields accordingly. The solver determines magnetizations of samples $S_Q$ generated at 406, M←mag($S_Q$), and adjusts the bias fields as follows:

for variables N in the augmented problem,
for i←0 to N−1 do $$h_i^{mf} \leftarrow h_i + \Sigma_j J_{i,j}^A M_j$$

end
where $J^A$ is an augmented portion of J.

At 412, the hybrid mean field solver adjusts bias values programmed into the quantum processor based at least in part on the value $h^{mf}$ determined at 410. After 412, control passes to 406, where the quantum processor generates a new set of samples $S_Q$' based on $J^N$ and $h^{mf}$.

At 414, method 400 terminates, until, for example, it is invoked again.

The above described method(s), process(es), or technique(s) could be implemented by a series of processor readable instructions stored on one or more nontransitory processor-readable media. Some examples of the above described method(s), process(es), or technique(s) method are performed in part by a specialized device such as an adiabatic quantum computer or a quantum annealer or a system to program or otherwise control operation of an adiabatic quantum computer or a quantum annealer, for instance a computer that includes at least one digital processor. The above described method(s), process(es), or technique(s) may include various acts, though those of skill in the art will appreciate that in alternative examples certain acts may be omitted and/or additional acts may be added. Those of skill in the art will appreciate that the illustrated order of the acts is shown for example purposes only and may change in alternative examples. Some of the example acts or operations of the above described method(s), process(es), or technique(s) are performed iteratively. Some acts of the above described method(s), process(es), or technique(s) can be performed during each iteration, after a plurality of iterations, or at the end of all the iterations.

The above description of illustrated implementations, including what is described in the Abstract, is not intended to be exhaustive or to limit the implementations to the precise forms disclosed. Although specific implementations of and examples are described herein for illustrative purposes, various equivalent modifications can be made without departing from the spirit and scope of the disclosure, as will be recognized by those skilled in the relevant art. The teachings provided herein of the various implementations can be applied to other methods of quantum computation, not necessarily the example methods for quantum computation generally described above.

The various implementations described above can be combined to provide further implementations. All of the commonly assigned US patent application publications, US patent applications, foreign patents, and foreign patent applications referred to in this specification and/or listed in the Application Data Sheet are incorporated herein by reference, in their entirety, including but not limited to: U.S. Provisional Patent Application No. 62/824,124, U.S. Pat. Nos. 7,533,068, 8,195,596, 8,063,657, 8,421,053, 8,772,759, 9,170,278, 9,178,154, 9,183,508, International Patent Publication No WO2017214331A1, and U.S. Pat. No. 10,268,622.

These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure.

The invention claimed is:

1. A method of operation of a hybrid computing system, the hybrid computing system comprising a digital processor and a quantum processor, the quantum processor comprising a plurality of qubits and one or more coupling devices, the qubits and the coupling devices defining a working graph of the quantum processor, the method comprising:
   receiving a computational problem by the digital processor, the computational problem having a problem graph comprising a plurality of nodes and a first and a second set of edges, each set of edges comprising one or more edges, a first portion of the problem graph comprising the set of nodes and the first set of edges, the first portion which fits the working graph of the quantum processor;
   programming the quantum processor by the digital processor with a first set of bias fields and a first set of coupling strengths;
   generating a first set of samples by the quantum processor, the first set of samples comprising one or more samples, the first set of samples comprising potential solutions to an approximation of the computational problem;
   determining a first set of mean fields by the digital processor, the first set of mean fields comprising one or more mean fields, the first set of mean fields based at least in part on the first set of samples and coupling strengths of one or more virtual coupling devices, each virtual coupling device corresponding to a respective edge in the second set of edges; and
   updating the approximation of the computational problem by determining a second set of bias fields based at least in part on the first set of bias fields and the first set of mean fields by the digital processor.

2. The method of claim 1, further comprising:
   programming the quantum processor by the digital processor with the second set of bias fields and a second set of coupling strengths; and
   generating a second set of samples by the quantum processor, the second set of samples comprising one or more samples, the second set of samples comprising potential solutions to the updated approximation of the computational problem.

3. The method of claim 2, wherein programming the quantum processor by the digital processor with a second set of coupling strengths includes programming the quantum processor by the digital processor with a second set of coupling strengths wherein the second set of coupling strengths is the same as the first set of coupling strengths.

4. The method of claim 1 wherein determining a first set of mean fields by the digital processor includes determining a first set of mean fields by a specialized classical co-processor.

5. The method of claim 4 wherein determining a first set of mean fields by a specialized classical co-processor includes determining a first set of mean fields by one or more field programmable gate arrays (FPGAs).

6. The method of claim 1 wherein determining a first set of mean fields by the digital processor includes determining magnetizations of the first set of samples.

7. The method of claim 6 wherein updating the approximation of the computational problem by determining a second set of bias fields $h_i'$ includes updating the first set of bias fields $h_i$ using the following equation:

$$h_i' \leftarrow h_i + \sum_j J_{i,j}^A M_j$$

wherein $M_i$ and $M_j$ are magnetizations of an $i^{th}$ and a $j^{th}$ qubit, respectively, and $J^A_{i,j}$ is a coupling strength of a virtual communicative coupling between an $i^{th}$ and a $j^{th}$ problem variable.

8. The method of claim 1 wherein determining a first set of mean fields by the digital processor, each virtual coupling device corresponding to a respective edge in the second set of edges includes determining a first set of mean fields by the digital processor, each virtual coupling device corresponding to a respective edge in the second set of edges, the second set of edges absent from the working graph of the quantum processor.

9. The method of claim 1 further comprising:
evaluating by the digital processor if an exit condition is met;
until the exit condition is met, iteratively, where i≥2:
  programming the quantum processor by the digital processor with the $i^{th}$ set of bias fields and an $i^{th}$ set of coupling strengths; and
  generating an $i^{th}$ set of samples by the quantum processor, the $i^{th}$ set of samples comprising one or more samples, the $i^{th}$ set of samples comprising potential solutions to the updated approximation of the computational problem;
  determining an $i^{th}$ set of mean fields by the digital processor, the $i^{th}$ set of mean fields comprising one or more mean fields, the $i^{th}$ set of mean fields based at least in part on the $i^{th}$ set of samples and coupling strengths of one or more virtual coupling devices, each virtual coupling device corresponding to a respective edge in the second set of edges; and
  updating the approximation of the computational problem by determining an $(i+1)^{th}$ set of bias fields based at least in part on the $i^{th}$ set of bias fields and the $i^{th}$ set of mean fields by the digital processor.

10. The method of claim 9, wherein programming the quantum processor by the digital processor with an $i^{th}$ set of coupling strengths includes programming the quantum processor by the digital processor with an $i^{th}$ set of coupling strengths wherein the $i^{th}$ set of coupling strengths is the same as the first set of coupling strengths.

11. The method of claim 9 wherein evaluating by the digital processor if an exit condition is met includes evaluating whether the $(i+1)^{th}$ set of samples is converging.

12. The method of claim 11 wherein evaluating whether the $(i+1)^{th}$ set of samples is converging includes evaluating whether a change between the $i^{th}$ set of bias fields and the $(i+1)^{th}$ set of bias fields exceeds a defined threshold.

13. The method of claim 9 wherein evaluating by the digital processor if an exit condition is met includes evaluating whether a count of iterations exceeds a defined limit.

14. The method of claim 9 wherein evaluating by the digital processor if an exit condition is met includes evaluating whether a change between the $i^{th}$ set of bias fields and the $(i+1)^{th}$ set of bias fields exceeds a defined threshold.

15. A hybrid computing system for solving a computational problem, the hybrid computing system comprising:
a digital processor;
a quantum processor, comprising a plurality of qubits and one or more coupling devices, the qubits and the coupling devices defining a working graph of the quantum processor; and
at least one nontransitory processor-readable medium communicatively coupleable to the digital processor, the nontransitory processor-readable medium which stores at least one of processor-executable instructions or data which, when executed by the digital processor, cause the digital processor to:
receive a computational problem, the computational problem having a problem graph comprising a plurality of nodes and a first and a second set of edges, each set of edges comprising one or more edges, a first portion of the problem graph comprising the set of nodes and the first set of edges, the first portion which fits the working graph of the quantum processor;
program the quantum processor with a first set of bias fields and a first set of coupling strengths;
generate a first set of samples by the quantum processor, the first set of samples comprising one or more samples, the first set of samples comprising potential solutions to an approximation of the computational problem;
determine a first set of mean fields, the first set of mean fields comprising one or more mean fields, the first set of mean fields based at least in part on the first set of samples and coupling strengths of one or more virtual coupling devices, each virtual coupling device corresponding to a respective edge in the second set of edges; and
update the approximation of the computational problem by determining a second set of bias fields based at least in part on the first set of bias fields and the first set of mean fields.

16. The hybrid computing system of claim 15, wherein the processor-executable instructions or data which, when executed by the digital processor, further cause the digital processor to:
program the quantum processor with the second set of bias fields and a second set of coupling strengths; and
generate a second set of samples by the quantum processor, the second set of samples comprising one or more samples, the second set of samples comprising potential solutions to the updated approximation of the computational problem.

17. The hybrid computing system of claim 16, wherein the second set of coupling strengths is the same as the first set of coupling strengths.

18. The hybrid computing system of claim 15 wherein the digital processor includes a specialized classical co-processor.

19. The hybrid computing system of claim 15 wherein the first set of mean fields includes magnetizations of the first set of samples.

20. The hybrid computing system of claim 19 wherein the second set of bias fields $h_i'$ is given by the following equation:

$$h_i' \leftarrow h_i + \sum_j J_{i,j}^A M_j$$

wherein $h_i$ is the first set of bias fields, $M_i$ and $M_j$ are magnetizations of an $i^{th}$ and a $j^{th}$ qubit, respectively, and $J_{i,j}^A$ is a coupling strength of a virtual communicative coupling between an $i^{th}$ and a $j^{th}$ problem variable.

21. The hybrid computing system of claim 15 wherein the second set of edges are absent from the working graph of the quantum processor.

22. The hybrid computing system of claim 15, wherein the processor-executable instructions or data which, when executed by the digital processor, further cause the digital processor to:
evaluate if an exit condition is met;
until the exit condition is met, iteratively, where i≥2:
program the quantum processor with the $i^{th}$ set of bias fields and an $i^{th}$ set of coupling strengths; and
generate an $i^{th}$ set of samples by the quantum processor, the $i^{th}$ set of samples comprising one or more samples, the $i^{th}$ set of samples comprising potential solutions to the updated approximation of the computational problem;
determine an $i^{th}$ set of mean fields by the digital processor, the $i^{th}$ set of mean fields comprising one or more mean fields, the $i^{th}$ set of mean fields based at least in part on the $i^{th}$ set of samples and coupling strengths of one or more virtual coupling devices, each virtual coupling device corresponding to a respective edge in the second set of edges; and
update the approximation of the computational problem by determining an $(i+1)^{th}$ set of bias fields based at least in part on the $i^{th}$ set of bias fields and the $i^{th}$ set of mean fields.

23. The hybrid computing system of claim 22, wherein the $i^{th}$ set of coupling strengths is the same as the first set of coupling strengths.

* * * * *